(12) United States Patent
Choi et al.

(10) Patent No.: US 8,778,728 B2
(45) Date of Patent: Jul. 15, 2014

(54) METHODS OF MANUFACTURING NON-VOLATILE PHASE-CHANGE MEMORY DEVICES

(75) Inventors: Byoung-deog Choi, Suwon-si (KR); Dong-ho Ahn, Hwaseong-si (KR); Man-sug Kang, Suwon-si (KR); Young-kuk Kim, Seoul (KR); Jin-ho Oh, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 339 days.

(21) Appl. No.: 13/160,761

(22) Filed: Jun. 15, 2011

(65) Prior Publication Data

US 2012/0088347 A1 Apr. 12, 2012

(30) Foreign Application Priority Data

Oct. 11, 2010 (KR) .................. 10-2010-0098827

(51) Int. Cl.
*H01L 21/00* (2006.01)
(52) U.S. Cl.
USPC .......................................... 438/102; 438/381

(58) Field of Classification Search
USPC .................................. 438/102, 381, 386–392
See application file for complete search history.

(56) References Cited

U.S. PATENT DOCUMENTS

| 5,789,758 | A  | * | 8/1998 | Reinberg ........................... 257/3 |
| 7,259,038 | B2 | * | 8/2007 | Scheuerlein .................... 438/95 |
| 7,642,125 | B2 |   | 1/2010 | Lung et al. |
| 8,192,592 | B2 | * | 6/2012 | Kim et al. ................. 204/192.26 |

FOREIGN PATENT DOCUMENTS

| KR | 100807223 | | 1/2008 |
| KR | 100814393 | B1 | 3/2008 |

* cited by examiner

*Primary Examiner* — Richard Booth
(74) *Attorney, Agent, or Firm* — Harness, Dickey & Pierce, P.L.C.

(57) ABSTRACT

Methods of manufacturing non-volatile memory devices may include separating first phase-change material groups and second phase-change material groups, which have different sizes, from a target including phase-change materials and faulting a phase-change material layer on an object by using the first phase-change material groups and the second phase-change material groups.

18 Claims, 15 Drawing Sheets

COMPARATIVE EXAMPLE
POROSITY RATIO=21.5%

EMBODIMENT OF
INVENTIVE CONCEPT
POROSITY RATIO=8%

METHODS OF MANUFACTURING NON-VOLATILE PHASE-CHANGE MEMORY DEVICES

CROSS-REFERENCE TO RELATED APPLICATION

This application claims priority under 35 U.S.C. §119 to Korean Patent Application No. 10-2010-0098827, filed on Oct. 11, 2010, in the Korean Intellectual Property Office (KIPO), the entire contents of which is incorporated herein by reference.

BACKGROUND

Example embodiments of the inventive concepts relate to non-volatile memory devices including phase-change material.

A non-volatile memory device used in a semiconductor product generally requires a quick operating speed, high integration, and a long lifetime. There is a device from among the non-volatile memory devices which performs a memory function according to a change of a state of a memory material. Such a device needs to maintain reliability and durability with respect to repeated change of a material state according to a memory operation.

SUMMARY

Some example embodiments of the inventive concepts may provide methods of manufacturing non-volatile memory devices capable of maintaining reliability and durability with respect to a repeated change of a material state according to a memory operation. Some example embodiments of the inventive concepts may provide memory cards and systems including non-volatile memory devices capable of maintaining reliability and durability with respect to a repeated change of a material sate according to a memory operation.

According to one example embodiment of the inventive concepts a method of manufacturing non-volatile memory device includes separating first phase-change material groups and second phase-change material groups, which have different sizes, from a target including phase-change materials; and foaming a phase-change material layer on an object by using the first phase-change material groups and the second phase-change material groups.

According to at least one example embodiment of the inventive concepts, the separating may be performed by using different gas ions. According to at least one example embodiment of the inventive concepts, the different gas ions may have different ion sizes or molecular weights. According to at least one example embodiment of the inventive concepts, the different gas ions may be at least two selected from the group consisting of argon ions, helium ions, and neon ions. According to at least one example embodiment of the inventive concepts, the separating may be performed by applying an acceleration voltage in different levels to the same gas ion. According to at least one example embodiment of the inventive concepts, the separating may be performed by applying a direct current power to the target. According to at least one example embodiment of the inventive concepts, the separating may further include separating third phase-change material groups having a size between a size of the first phase-change material groups and a size of the second phase-change material groups.

According to at least one example embodiment of the inventive concepts, the method may further include plasma-etching at least a part of the phase-change material layer. According to at least one example embodiment of the inventive concepts, the forming of the phase-change material layer and the plasma-etching may be performed at the same time or sequentially. According to at least one example embodiment of the inventive concepts, the forming of the phase-change material layer and the plasma-etching may be alternately repeatedly performed. According to at least one example embodiment of the inventive concepts, the plasma-etching may be performed by using at least one gas ion selected from the group consisting of an argon ion, an helium ion, and a neon ion. According to at least one example embodiment of the inventive concepts, the plasma-etching may be performed by applying high frequency power on the object.

According to at least one example embodiment of the inventive concepts, the method may further include, after the forming of the phase-change material layer, heat-treating the phase-change material layer. According to at least one example embodiment of the inventive concepts, the object may include one or more openings, and the phase-change material layer is formed to fill the one or more openings. According to at least one example embodiment of the inventive concepts, the one or more openings may expose a conductive layer included in the object. According to at least one example embodiment of the inventive concepts, the phase-change material layer may be formed on the conductive layer. According to at least one example embodiment of the inventive concepts, the phase-change material layer may have a shape extending in one direction or an individually separated shape.

According to other example embodiments of the inventive concepts, a method of manufacturing a non-volatile memory device includes forming a lower electrode on a substrate, forming an insulating layer on the lower electrode, forming an opening for exposing at least a part of the lower electrode by etching the insulating layer and filling the opening by using phase-change material groups having different sizes.

According to still other example embodiments of the inventive concepts, a method of manufacturing a non-volatile memory device includes separating phase-change material groups having different sizes from a target including phase-change materials by using different gas ions and forming a phase-change material layer on an object by using the separated phase-change material groups.

According to further example embodiments of the inventive concepts, a memory card with a non-volatile memory device includes a memory including the non-volatile memory device manufactured by using the method above; and a controller for controlling the memory and receiving and transmitting data with the memory. According to still further example embodiments of the inventive concepts, a system including a non-volatile memory device includes a memory with the non-volatile memory device manufactured by using the method above, a processor communicating with the memory through a bus, and an input and output device communicating with the bus.

According to at least one example embodiment, a method of manufacturing a non-volatile memory device includes separating at least one first phase-change material group and at least one second phase-change material group from a target including at least one phase-change material, a size of the first phase-change material group different from a size of the second phase change material group, and forming a phase-change material layer on an object including the first phase-change material group and the second phase-change material group.

According to at least one example embodiment, a method of manufacturing a non-volatile memory device includes forming a lower electrode on a substrate, forming an insulating layer on the lower electrode, etching a region of the insulating layer to expose at least a part of the lower electrode and forming a phase-change material layer in the region, the phase-change material layer including a plurality of phase-change material groups of different sizes.

According to at least one example embodiment, a method of manufacturing a non-volatile memory device includes forming a heterogeneous phase-change layer including a mixture of a plurality of first groups of a phase-change material and a plurality of second groups of a phase change material.

BRIEF DESCRIPTION OF THE DRAWINGS

Example embodiments will be more clearly understood from the following brief description taken in conjunction with the accompanying drawings.

FIG. 1 is schematic diagram illustrating non-volatile memory arrays according to at least one example embodiment of the inventive concepts;

FIG. 2 is a graph of temperature as a function of time illustrating methods of performing set or reset programming on phase-change material layers according to at least one example embodiment of the inventive concepts;

FIG. 3 is a cross-sectional diagram illustrating non-volatile memory devices according to at least one example embodiment of the inventive concepts;

FIGS. 4 and 5 are plan views taken along line IV-IV' of FIG. 3;

FIG. 6 is a flowchart illustrating methods of manufacturing non-volatile memory devices according to at least one example embodiment of the inventive concepts;

FIGS. 7 and 8 are schematic views illustrating sputtering apparatuses for performing methods of manufacturing non-volatile memory devices according to at least one example embodiment of the inventive concepts;

FIG. 9 is a flowchart illustrating methods of manufacturing non-volatile memory devices according to at least one other example embodiment of the inventive concepts;

FIG. 10 is a flowchart illustrating methods of manufacturing non-volatile memory devices according to at least one further example embodiment of the inventive concepts;

FIGS. 11-15 are cross-sectional diagrams illustrating methods of manufacturing non-volatile memory devices according to at least one example embodiment of the inventive concepts;

FIG. 16 includes diagrams illustrating a comparison between densification of a phase-change material layer according to at least one example embodiment of the inventive concepts and a comparative example;

FIG. 17 is a diagram illustrating phase-change material layers formed using methods of manufacturing non-volatile memory devices according to at least one example embodiment of the inventive concepts;

FIG. 18 is a schematic diagram illustrating memory cards according to example embodiments of the inventive concepts; and FIG. 19 is a schematic diagram illustrating systems according to example embodiments of the inventive concepts.

Figure 1:
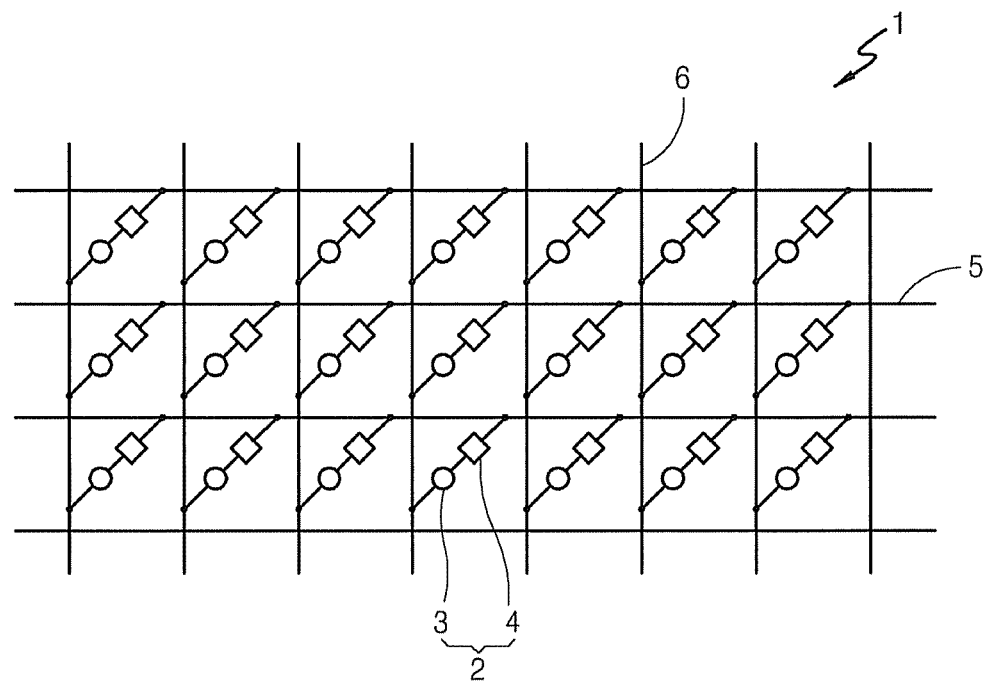
FIGS. 1-19 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Reference will now be made in detail to example embodiments illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is schematic diagram illustrating non-volatile memory arrays according to at least one example embodiment of the inventive concepts. Referring to FIG. 1, the non-volatile memory array 1 may include a plurality of memory device unit cells 2 arranged in a matrix form. Each of the memory device unit cells 2 may include a memory portion 3 and an access portion 4. A memory device unit cell 2 may be electrically connected to a first address line 5 and a second address line 6. The first address line 5 and the second address line 6 may be 2-dimensionally arranged at an angle with respect to each other. The angle may be 90°, but is not limited thereto. One of the first address line 5 and the second address line 6 may be electrically connected to a bit line and the other may be electrically connected to a word line.

The memory portion 3 may include a phase-change material, a ferroelectric material, and/or a magnetic material. A state of the memory portion 3 may be determined according to an amount of current supplied to the memory portion 3 through the bit line. The access portion 4 may control the current supplied to the memory portion 3 according to a voltage of the word line. The access portion 4 may be, for example, a diode, a bipolar transistor, and/or a metal oxide semiconductor (MOS) transistor. According to example embodiments, a phase-change random access memory (PRAM) including a phase-change material may be an example of a memory device of the memory portion 3. However, the memory device may also be, for example, a resistance RAM (RRAM), a ferroelectric RAM (FRAM), and/or a magnetic RAM (MRAM).

Figure 2:
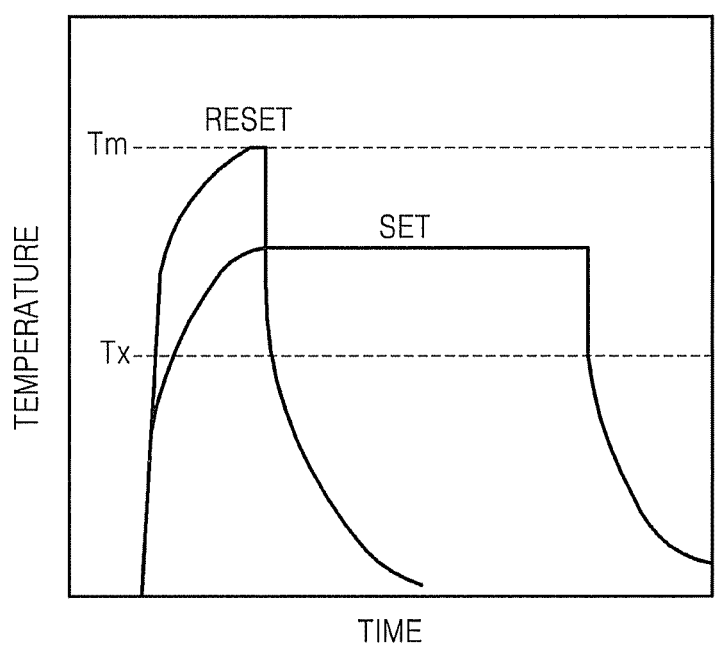

FIG. 2 is a graph of temperature as a function of time illustrating methods of performing set or reset programming on phase-change material layers included in a memory portion of FIG. 1, according to at least one example embodiment of the inventive concepts. Referring to FIG. 2, the phase-change material layer may be heated for a period of time at a temperature between a crystallization temperature Tx and a melting point Tm, and then slowly cooled. The state of the phase-change material layer may change to a crystalline state. The crystalline state may be referred to as a set state in which a data '0' may be stored in the phase-change material layer. The phase-change material layer may be heated to a temperature equal to or above the melting point Tm and then quickly cooled. The state of the phase-change material layer may change to an amorphous state. The amorphous state may be referred to as a reset state in which a data '1' may be stored in the phase-change material layer. Data may be stored in the phase-change material layer by supplying a current heating a phase change material and data may be read by measuring a resistance value of the phase-change material layer.

A heating temperature of the phase-change material layer may be proportional to an amount of current and it may be difficult to achieve high and/or improved integrity as the amount of current increases. Because a greater amount of current may be required to change the state of the phase-change material layer to the amorphous state (reset state) than to the crystallization state (set state), power consumption of the memory device may increase. In order to reduce power consumption, it may be required to change a state of the phase-change material layer from the crystallization state to the amorphous state by heating the phase-change material layer using a low and/or decreased amount of current. In order to achieve high integrity, it may be required to reduce a current (e.g., a reset current) for changing the phase-change material layer to the amorphous state.

Figure 3:
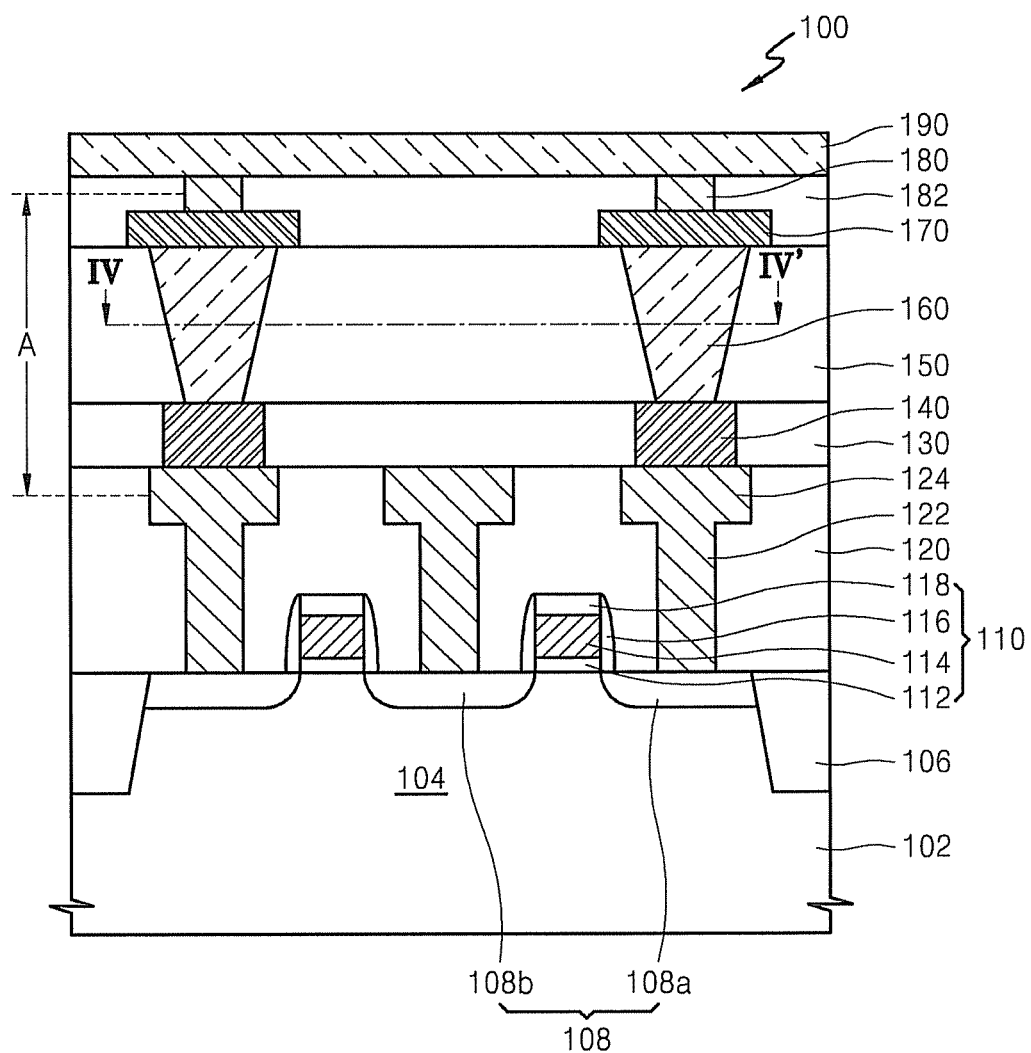

A non-volatile memory device including a phase-change material layer generally may include a plurality of unit cells (e.g., unit cells 2 of FIG. 1) including an access portion (e.g., the access portion 4 of FIG. 1) and a memory portion (e.g., the memory portion illustrated in FIG. 3). The memory portion may include a phase-change material layer. The phase-change material layer may generally be between a lower electrode and an upper electrode, and the access portion may be electrically connected to the lower electrode. Heating of the phase-change material layer at a temperature between a crystallization temperature and a melting point or at a temperature greater than or equal to the melting point may be performed according to an amount of write current flowing through the lower electrode and the access portion. When write current flows through the lower electrode and the access portion, Joule heat may be generated at an interface between the lower electrode and the phase-change material layer, and a temperature of the Joule heat may be determined according to an amount of the write current.

FIG. 3 is a cross-sectional diagram illustrating non-volatile memory devices according to at least one example embodiment of the inventive concepts. Referring to FIG. 3, a non-volatile memory device 100 may include a substrate 102, a gate structure 110 on the substrate 102, a lower electrode 140, a phase-change material layer 160, and an upper electrode 170. According to at least one example embodiment, the memory portion 3 of FIG. 1 may correspond to a structure including the lower electrode 140, the phase-change material layer 160, and the upper electrode 170. The access portion 4 of FIG. 1 may correspond to the gate structure 110.

The substrate 102 may include a device isolation layer 106 that defines an active region 104. The substrate 102 may include a dielectric layer including, for example, a silicon oxide, a titanium oxide, an aluminum oxide, a zirconium oxide, and/or a hafnium oxide, a conductive layer including titanium (Ti), titanium nitride (TiN), aluminum (Al), tantalum (Ta), Tantalum nitride (TaN), and/or titanium aluminum nitride (TiAlN), and/or a semiconductor layer formed of silicon (Si), silicon-germanium (SiGe), and/or silicon carbide (SiC). The substrate 102 may include an epitaxial layer, a silicon-on-insulator (SOI) layer, and/or a semiconductor-on-insulator (SEOI) layer. The substrate 102 may further include a word line (not shown), a bit line (not shown), and/or other semiconductor devices. The device isolation layer 106 may be formed by using a general shallow trench isolation (STI) method.

The active region 104 may include an impurity region 108. The impurity region 108 may include a low concentration impurity region (not shown) adjacent to the gate structure 110, and a high concentration impurity region (not shown) spaced apart from the gate structure 110. The impurity region 108 may include a source region 108a and a drain region 108b. The gate structure 110 may be on the active region 104. The gate structure 110 may include a gate insulating layer 112, a gate electrode layer 114, a spacer 116, and a capping layer 118. The gate structure 110, the source region 108a, and the drain region 108b may form a MOS transistor that operates as an access device. However, the gate structure 110 may not be limited to the MOS transistor, but may also be, for example, a diode and/or a bipolar transistor.

A first interlayer insulating layer 120 covering the gate structure 110 may be on the substrate 102. The first interlayer insulating layer 120 may include, for example, an oxide, a nitride and/or an oxynitride. For example, the first interlayer insulating layer 120 may include at least one of a silicon oxide, a silicon nitride, and/or a silicon oxynitride. The first interlayer insulating layer 120 may include a first contact plug 122 electrically contacting the impurity region 108. In other words, a part of the first contact plug 122 may electrically contact the source region 108a, and another first contact plug 122 may electrically contact the drain region 108b. As illustrated in FIG. 3, the first contact plug 122 may include an expanded region 124 thereon, and the expanded region 124 may increase an electrical contact between the first contact plug 122 and the lower electrode 140. The first contact plug 122 may include, for example, at least one of titanium (Ti), titanium nitride (TiN), tungsten (W object), and tungsten nitride (WN), or a stacked structure thereof. The first contact plug 122 may be a single layer including any one material thereof, a single layer including a plurality of materials thereof, a multilayer each layer including a single material thereof, and/or a multilayer each layer including a plurality of materials thereof.

A second interlayer insulating layer 130 may be on the first interlayer insulating layer 120. The second interlayer insulating layer 130 may include, for example, an oxide, a nitride and/or an oxynitride. For example, the second interlayer insulating layer 130 may include at least one of a silicon oxide, a silicon nitride, and a silicon oxynitride. The lower electrode 140 may be inside the second interlayer insulating layer 130. The lower electrode 140 may be on the first contact plug 122, and may be electrically connected to the first contact plug 122. The lower electrode 140 may be electrically connected to the gate structure 110 through the first contact plug 122 and the drain region 108b. The lower electrode 140 and the first contact plug 122 may be a one-piece body. The lower electrode 140 may be formed by using, for example, a general etch method, a damascene method, and/or a dual damascene method.

The lower electrode 140 may include, for example, a metal. The lower electrode 140 may include, for example, aluminum (Al), copper (Cu), tungsten (W object), titanium (Ti), and/or tantalum (Ta)), an alloy (e.g., titanium tungsten (TiW) and/or titanium aluminum (TiAl)), and/or carbon (C). The lower electrode 140 may include, for example, carbon nitride (CN), titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), cobalt silicon (CoSi), tungsten silicon (WSi), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium carbonitride (TiCN), and/or tantalum carbonitride (TaCN). The lower electrode 140 may be a single layer including any one material thereof, a single layer including a plurality of materials thereof, a multilayer each layer including a single material thereof, and/or a multilayer each layer including a plurality of materials thereof. A shape of the lower electrode 140 may be an extended line shape and/or an array of a plurality of polyhedrons. A shape of the lower electrode 140 may be a ring shape filled with a material different from the lower electrode 140, for example, an insulator.

A third interlayer insulating layer 150 may be on the second interlayer insulating layer 130. The third interlayer insulating layer 150 may be, for example, an oxide, a nitride, and/or an oxynitride. For example, the third interlayer insulating layer 150 may include at least one of a silicon oxide, a silicon nitride, and/or a silicon oxynitride. The third interlayer insulating layer 150 may be of the same material as the second interlayer insulating layer 130. The third interlayer insulating layer 150 and the second interlayer insulating layer 130 may be selectively etched with respect to each other. The phase-change material layer 160 may be inside the third interlayer insulating layer 150. The phase-change material layer 160 may be on the lower electrode 140, and may be electrically connected to the lower electrode 140. A crystallization state of at least a part of the phase-change material layer 160 may change. The bottom of the phase-change material layer 160 may be smaller than, equal to, or larger than the top of the lower electrode 140.

The phase-change material layer 160 may include a phase-change material. For example, the phase-change material layer 160 may include a chalcogenide material, for storing data according to different crystallization states as described above. For example, the phase-change material layer 160 may include at least one of Ge—Te, Ge—Sb—Te, Ge—Te—Se, Ge—Te—As, Ge—Te—Sn, Ge—Te—Ti, Ge—Bi—Te, Ge—Sn—Sb—Te, Ge—Sb—Se—Te, Ge—Sb—Te—S, Ge—Te—Sn—O, Ge—Te—Sn—Au, Ge—Te—Sn—Pd, Sb—Te, Se—Te—Sn, Sb—Se—Bi, In—Se, In—Sb—Te, Sb—Se and Ag—In—Sb—Te. The phase-change material layer 160 may include a metal. The phase-change material layer 160 may be doped with at least one of carbon (C), nitrogen (N), silicon (Si), oxygen (O), bismuth (Bi), and tin (Sn). A driving current of the non-volatile memory device 100 may be decreased according to such doping.

Although not illustrated, the non-volatile memory device 100 may include a seed layer between the lower electrode 140 and the phase-change material layer 160. The seed layer may facilitate easy and/or improved formation of the phase-change material layer 160. The phase-change material layer 160 may be formed, for example, via sputtering. The phase-change material layer 160 may be formed via sputtering by using a plurality of gas ions (e.g., helium ions, neon ions and/or argon ions). The phase-change material layer 160 may include phase-change material groups with different sizes. The phase-change materials may be formed by the gas ions.

The phase-change material groups with different sizes may be adhered to each other by heat-treating the phase-change material layer 160.

The upper electrode 170 may be on the phase-change material layer 160. The phase-change material layer 160 may be electrically connected to the upper electrode 170. A material of the upper electrode 170 may be the same or similar to the material of the lower electrode 140. The lower and upper electrodes 140 and 170 may be of the same material or different materials. A second contact plug 180 may be on the upper electrode 170. The upper electrode 170 and the second contact plug 180 may be electrically connected to each other. A material of the second contact plug 180 may be the same or similar to a material of the first contact plug 122. The first and second contact plugs 122 and 180 may be formed of the same material or different materials. The upper electrode 170 and the second contact plug 180 may be surrounded by a fourth interlayer insulating layer 182.

The fourth interlayer insulating layer 182 may include, for example, an oxide, a nitride and/or an oxynitride. For example, the fourth interlayer insulating layer 182 may include at least one of a silicon oxide, a silicon nitride and a silicon oxynitride. An upper wiring 190 may be on and electrically connected to the second contact plug 180. Layers described above (e.g., the first interlayer insulating layer 120, the first contact plug 122, the second interlayer insulating layer 130, the lower electrode 140, the third interlayer insulating layer 150, the upper electrode 170, the second contact plug 180, and the upper wiring 190) may be formed by, for example, using a sputtering method, a CVD method, a PECVD method, and/or an ALD method. Such layers may be flattened by using, for example, a general photolithography method, an etching method, a chemical mechanical polishing (CMP) method, and/or a dry etching method.

Figure 4:
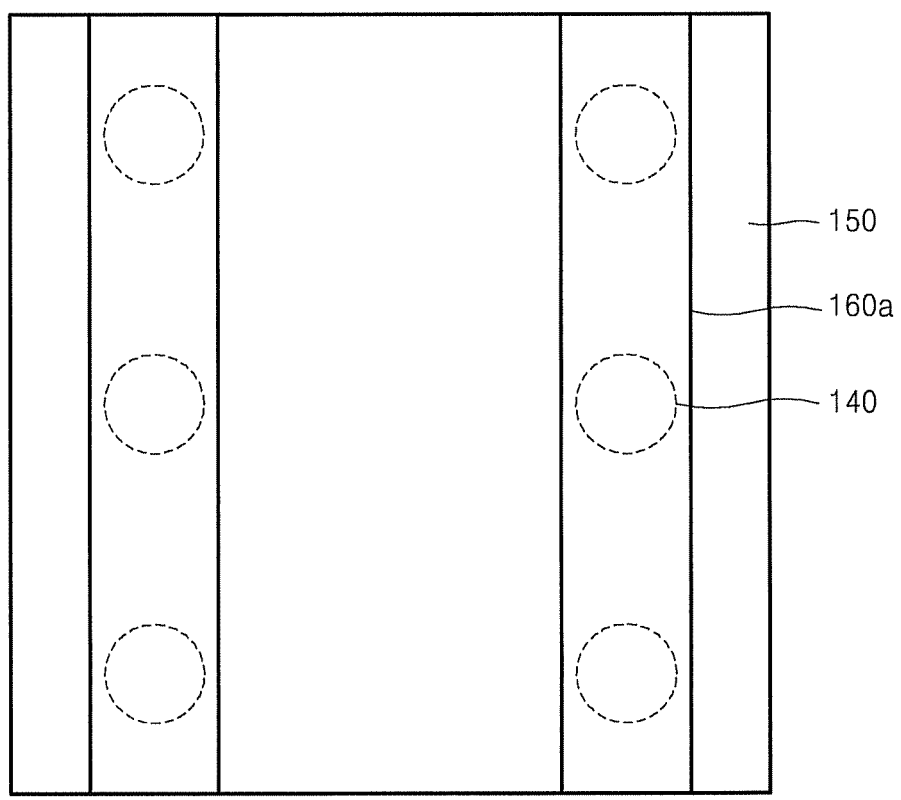
Figure 5:
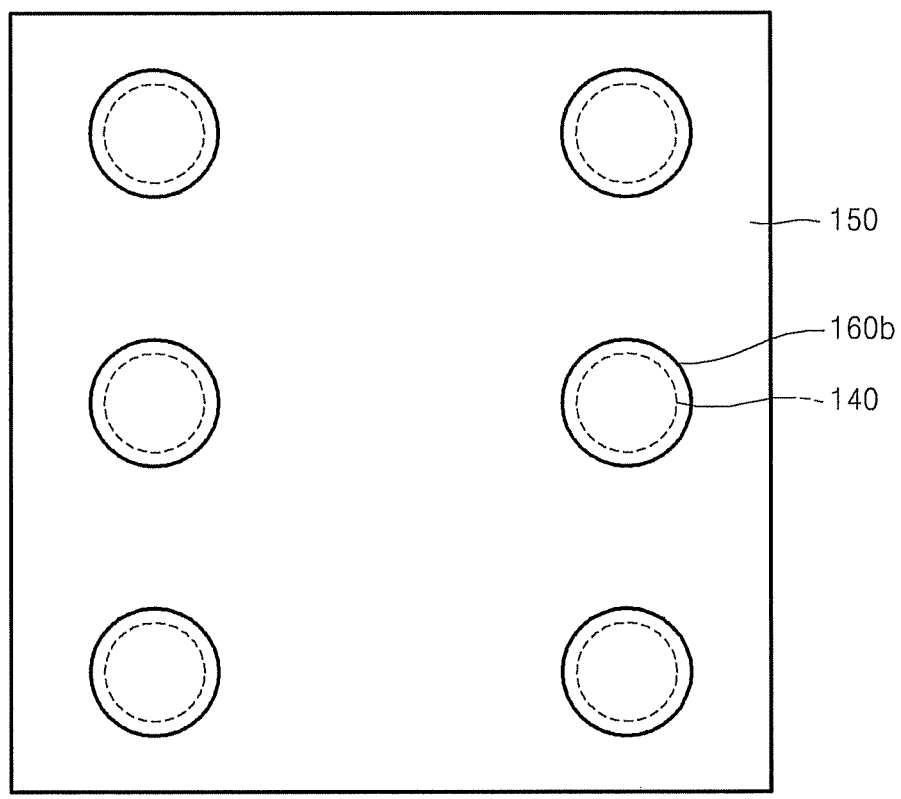

FIGS. 4 and 5 are plan views taken along a line IV-IV' of FIG. 3. Referring to FIG. 4, a phase-change material layer 160a may be inside the third interlayer insulating layer 150, and may be in a line shape extending in a first direction. The plurality of lower electrodes 140 that are separated from each other may be below the phase-change material layer 160a. In FIG. 4, the lower electrodes 140 may be illustrated in dotted lines. A shape of the lower electrode 140 may be a circular and/or a polygonal shape. Referring to FIG. 5, a shape of the phase-change material layer 160b may be a circular and/or polygonal shape that is individually separated according to nodes. The plurality of lower electrodes 140 that are separated from each other may be disposed below the phase-change material layer 160b. In FIG. 5, the lower electrodes 140 may be illustrated as dotted lines. A shape of the lower electrode 140 may be a circular and/or a polygonal shape. In FIG. 5, a diameter of the phase-change material layer 160b may be larger diameter than the lower electrode 140, but the diameter of the phase-change material layer 160b may not be limited thereto.

Figure 6:
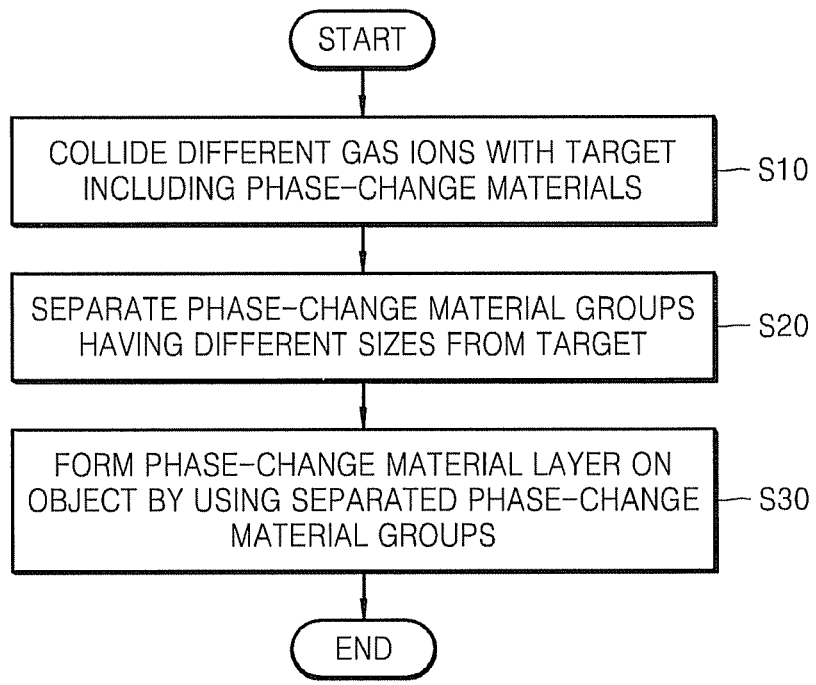

FIG. 6 is a flowchart illustrating methods of manufacturing non-volatile memory devices according to at least one example embodiment of the inventive concepts. Referring to FIG. 6, different gas ions may be collided with a target including phase-change materials in operation S10. Phase-change material groups with different sizes may be separated from the target in operation S20. A phase-change material layer may be formed on an object by using the separated phase-change material groups such that the phase-change material layer is heterogeneous in operation S30.

Figure 7:
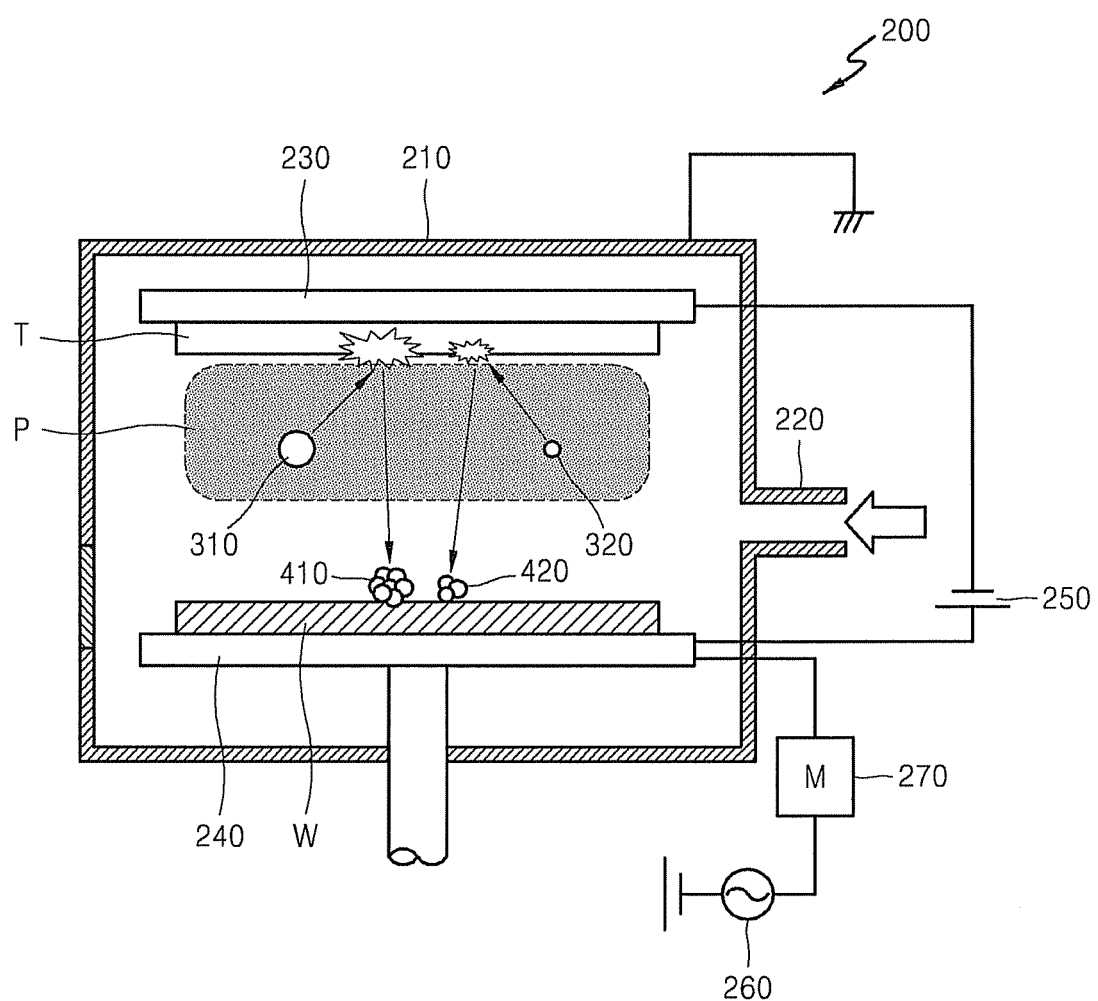
Figure 8:
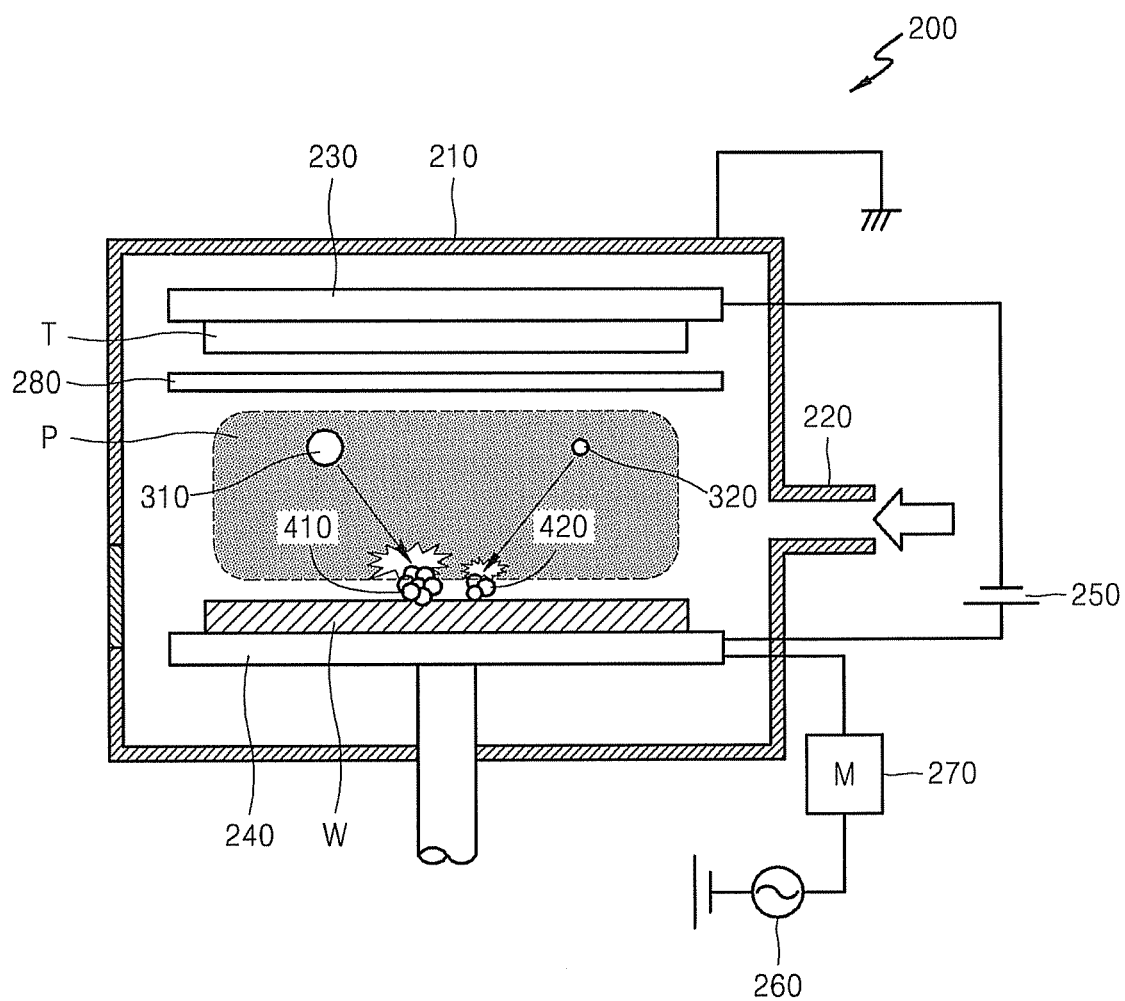

FIGS. 7 and 8 are schematic views illustrating sputtering apparatuses for performing methods of manufacturing non-volatile memory devices according to at least one example embodiment of the inventive concepts. FIG. 7 may be used to describe sputtering, and FIG. 8 may be used to describe plasma-etching. Referring to FIG. 7, a sputtering apparatus 200 may include a chamber 210 for performing sputtering, a gas supply pipe 220 for supplying a gas to the chamber 210, a target support 230 for supporting a target T, an object support 240 facing the target support 230 and supporting an object W, and a direct current (DC) power supply source 250 for applying a DC voltage between the target support 230 and the object support 240. The sputtering apparatus 200 may include a high frequency power supply source 260 for supplying a bias voltage to the object W, and a matching box 270.

The object W may be, for example, a substrate, for example, the substrate 102 of FIG. 3 that includes a conductive layer (e.g., the lower electrode 140 of FIG. 3). The phase-change material layer 160 of FIG. 3 may be formed on the conductive layer. The target T may be used to form the phase-change material layer on the object W. The phase-change materials may be mixed in a ratio on one target T. There may be a plurality of targets T, and each target T may include elements for forming one phase-change material. The target T may include, for example, at least one of a nitrogen (N) atom, an oxygen (O) atom, a silicon (Si) atom, and a carbon (C) atom to be doped on the phase-change material layer. Because a structure and a method of forming the target T may be well known to one of ordinary skill in the art, descriptions thereof will be omitted herein.

The target support 230 may include a magnetic member. High density plasma may be formed around the target T by the magnetic member, compared to other regions in the chamber 210, and more phase-change materials may be separated from the target T thereby increasing a speed of forming the phase-change material layer on the object W. The gas supplied to the chamber 210 through the gas supply pipe 220 may be an inert gas (e.g., a helium gas, a neon gas, and/or an argon gas). The gas may include, for example, at least one of a N atom, an O atom, a Si atom, and a C atom to be doped on the phase-change material layer. The gas may include, for example, at least one of a nitrogen (N2) gas, an oxygen (O2) gas, an ozone (O3) gas, a nitrogen dioxide (N20) gas, and an ammonia (NH3) gas.

The sputtering apparatus 200 may perform sputtering as follows. The target T may be installed on the target support 230 inside the chamber 210, and the object W may be loaded on the object support 240. Gas may be supplied into the chamber 210 through the gas supply pipe 220. The gas may include one or a plurality of gases. The plurality of gases may include different ion sizes and/or different molecular weights. For example, the gas may include at least one of helium, neon, and argon. Table 1 below shows atom radiuses, size ratios, molecular weights, and molecular weight ratios of helium, neon, and argon. Because it may be difficult to measure ion radiuses of helium, neon, and argon, the atom radiuses may be shown instead. When gases are mixed, a first gas may have a first ion size or a first molecular weight, and a second gas may have a second ion size smaller than the first ion size and a second molecular weight smaller than the first molecular weight. For example, the first gas may be argon, and the second gas may be helium, neon, or a mixed gas of helium and neon. The first gas may be neon and the second gas may be helium. The gas may include argon, helium and neon.

TABLE

| Type of Gas | Atom Radius (nm) | Size Ratio with respect to Helium | Molecular Weight | Molecular Weight Ratio with respect to Helium |
|---|---|---|---|---|
| Helium (He) | 0.150 | 1 | 4 | 1 |
| Neon (Ne) | 0.159 | 1.12 | 20 | 5 |
| Argon (Ar) | 0.191 | 1.62 | 40 | 10 |

DC power may be applied between the target T and the object W by using the DC power supply source 250, thereby forming plasma P. The gas may be ionized in the plasma P, thereby forming first gas ions 310 and second gas ions 320 with different ion sizes and/or different molecular weights. The first gas ions 310 and second gas ions 320 may collide with the target T so as to separate phase change material, for example, first phase-change material groups 410 and second phase-change material groups 420, from the target T. The first gas ions with a large ion radius and/or molecular weight may separate the first phase-change material groups 410 with a first size from the target T. The second gas ions 320 with a relatively small ion radius and/or molecular weight compared to the first gas ions 310 may separate the second phase-change material groups 420 with a second size relatively smaller than the first size from the target T.

The first and second gas ions 310 and 320 may be the same gas ions with kinetic energy of different levels according to an acceleration voltage of different levels that may be applied using the DC power supply source 250. For example, the first and second gas ions 310 and 320 may be argon ions. The first gas ions 310 may be accelerated at about 1 keV and the second gas ions 320 may be accelerated at about 0.5 keV. The acceleration voltage in different levels may be realized as the DC power supply source 250 supplies the DC power in such a way that the DC power changes according to time, for example, in a pulse waveform. The first and second phase-change material groups 410 and 420 may be phase-change materials formed in a lump shape, and may have the same characteristics but different sizes. If the first and second gas ions 310 and 320 are positive ions, a negative voltage may be applied to the target T. The separated phase-change materials may form a phase-change material layer on the object W. During the sputtering, the high frequency power supply source 260 and the matching box 270 may not operate.

Referring to FIG. 8, the high frequency power may be applied to the object support 240 supporting the object W by using the high frequency power supply source 260 and the matching box 270. The gas ionized in the plasma P may faun the first and second gas ions 310 and 320. The first and second gas ions 310 and 320 may collide with the object W according to the high frequency power, for example, with the first and second phase-change material groups 410 and 420 formed via the sputtering described above. The first and second phase-change material groups 410 and 420 may be plasma-etched. The target T may be blocked by a shutter 280. The sputtering (FIG. 7) and plasma-etching (FIG. 8) may be performed sequentially or at the same time. The sputtering and plasma-etching may be repeatedly alternately performed.

Figure 9:
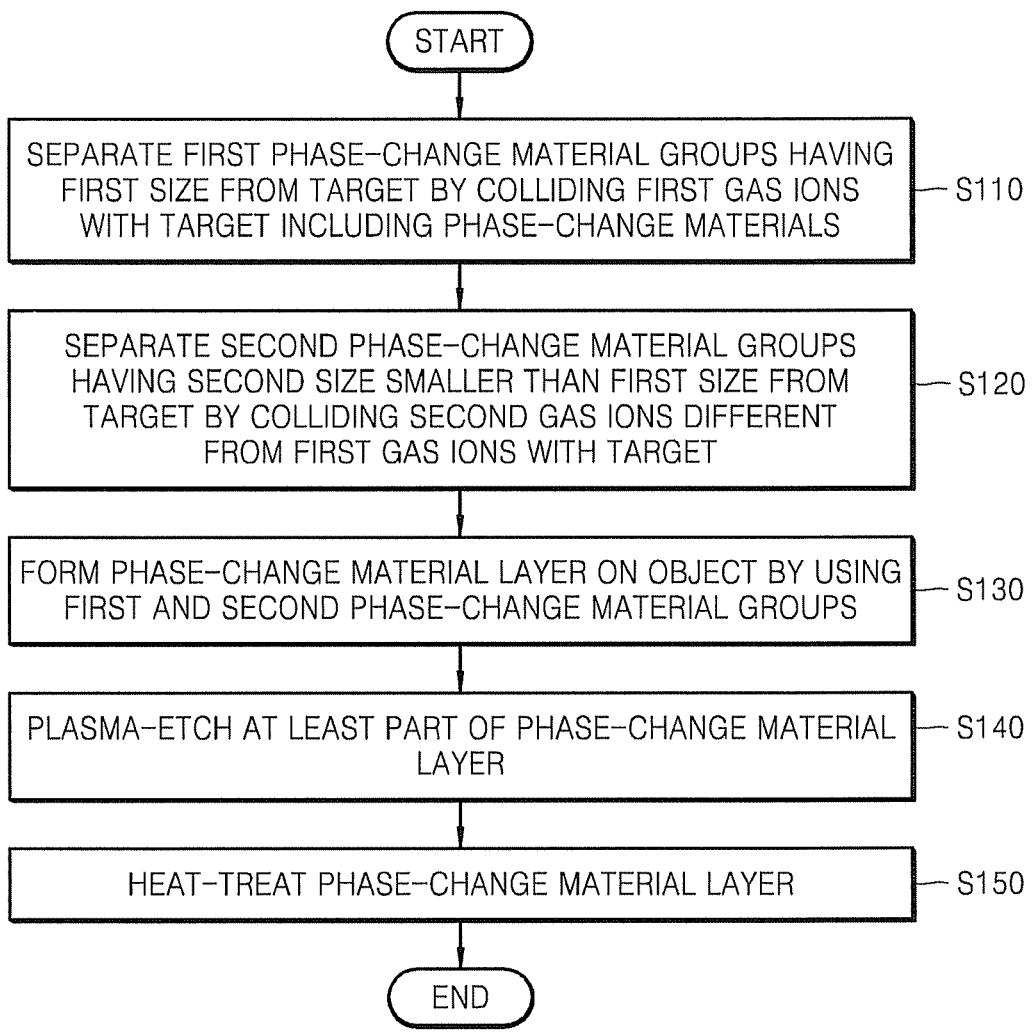

FIG. 9 is a flowchart illustrating methods of manufacturing non-volatile memory devices according to at least one other example embodiment of the inventive concepts. Referring to FIGS. 7-9, the first gas ions 310 ionized by the plasma P may be collided with the target T including the phase-change materials, thereby separating the first phase-change material groups 410 with the first size from the target T, in operation S110. The second gas ions 320 ionized by the plasma P may be collided with the target T, thereby separating the second phase-change material groups 420 with the second size smaller than the first size from the target T, in operation S120. Operations S110 and S120 may be performed by applying the DC power to the target T. The first and second gas ions 310 and 320 may include, for example, at least one of helium ions, neon ions and argon ions. The first gas ions 310 may be a larger ion size, a larger molecular weight, and/or higher kinetic energy by an acceleration voltage of a higher level than the second gas ions 320.

The phase-change material layer may be formed on the object W by using the first and second phase-change material groups 410 and 420, in operation S130. Operations S110 and S120 may be performed at the same time, sequentially or alternately repeatedly. When the first and second gas ions 310 and 320 are different gas ions, the first and second gas ions 310 and 320 may be supplied together to the chamber 210 so as to simultaneously perform operations S110 and S120, or may be separately supplied to the chamber 210 so as to perform operations S110 and S120 sequentially or alternately repeatedly. When the first and second gas ions 310 and 320 are the same gas ions and have different kinetic energies, operations S110 and S120 may be sequentially or alternately repeatedly performed by differentiating an applied DC voltage.

At least a part of the phase-change material layer may be plasma-etched in operation S140. Operation S140 may be performed by using at least one of the first and second gas ions 310 and 320. The second gas ions 320 with the smaller ion radius may be effective in removing materials formed inside an opening (e.g., a trench and/or a hole) and removing a defect (e.g., an overhang). Operations S130 and S140 may be performed simultaneously, sequentially or alternately repeatedly (e.g., alternating between sputtering and etching multiple times). When operations S130 and S140 are simultaneously performed, the phase-change material layer may be simultaneously deposited and etched, and the shutter 280 of FIG. 8 may be disposed in such a way that the target T may not be blocked. The phase-change material layer may be heat-treated in operation S150. In operation S150, the first and second phase-change material groups 410 and 420 may be adhered to each other to form a dense structure.

Figure 10:
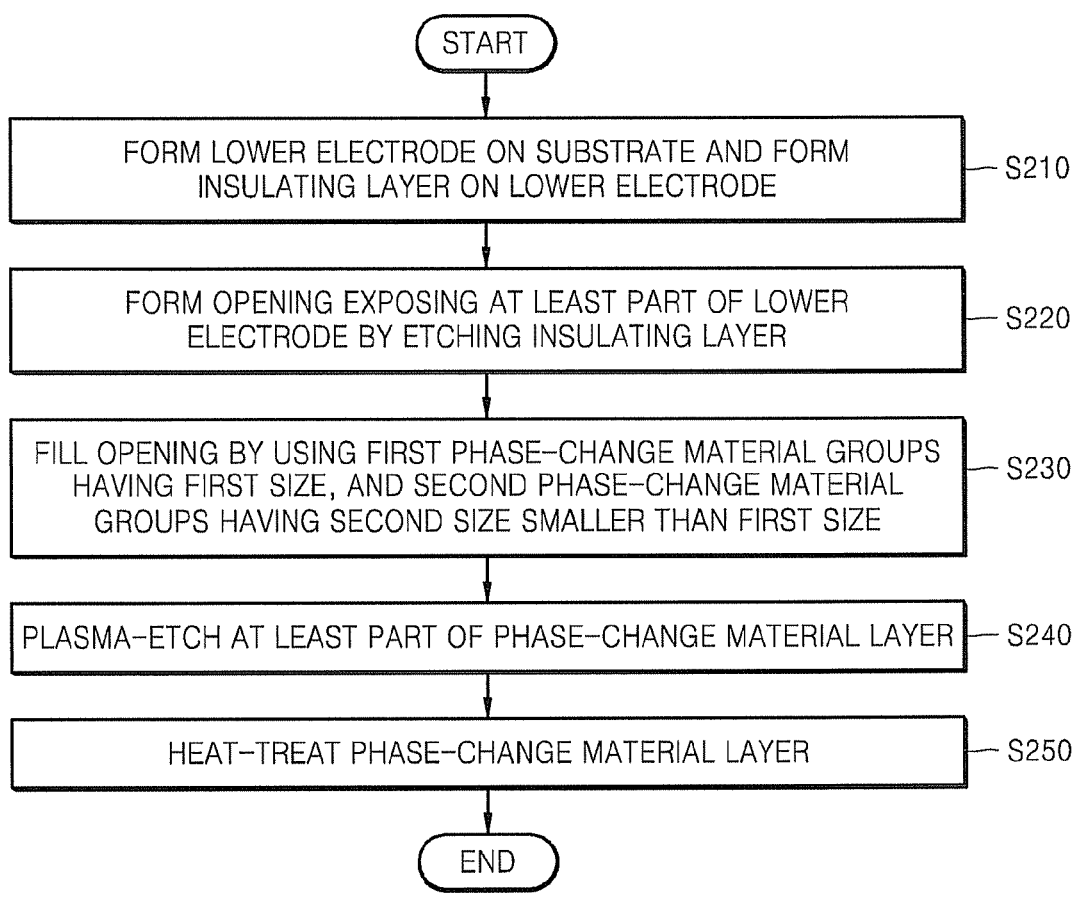
Figure 11:
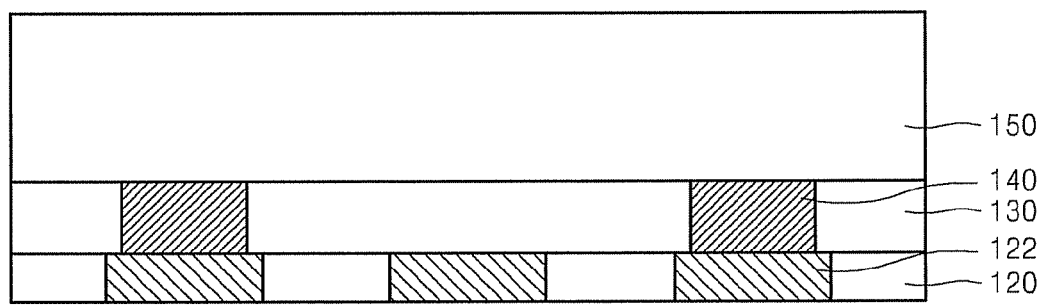

FIG. 10 is a flowchart illustrating methods of manufacturing non-volatile memory devices according to at least one further example embodiment of the inventive concepts. FIGS. 11-15 are cross-sectional diagrams illustrating methods of manufacturing non-volatile memory devices according to at least one example embodiment of the inventive concepts. In FIGS. 11-15, only a region A of FIG. 3 may be enlarged and illustrated. Description with respect to elements of FIGS. 11-15 substantially identical to or corresponding to those of FIG. 3 may not be repeated. Referring to FIGS. 10 and 11, the second interlayer insulating layer 130 and the lower electrode 140 may be electrically connected to the first contact plug 122 and may be formed on the substrate 102 of FIG. 3 including the first interlayer insulating layer 120 and the first contact plug 122. The third interlayer insulating layer 150 may be formed on the second interlayer insulating layer 130 and the lower electrode 140, in operation S210. As described above, the lower electrode 140 may be a conductive layer.

Figure 12:
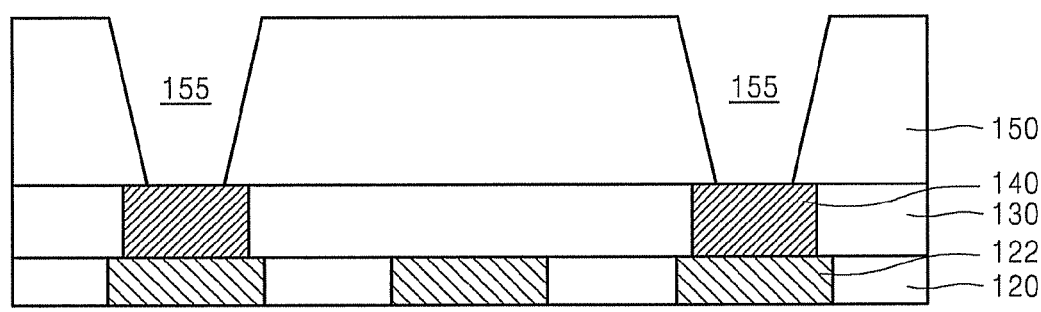
Figure 13:
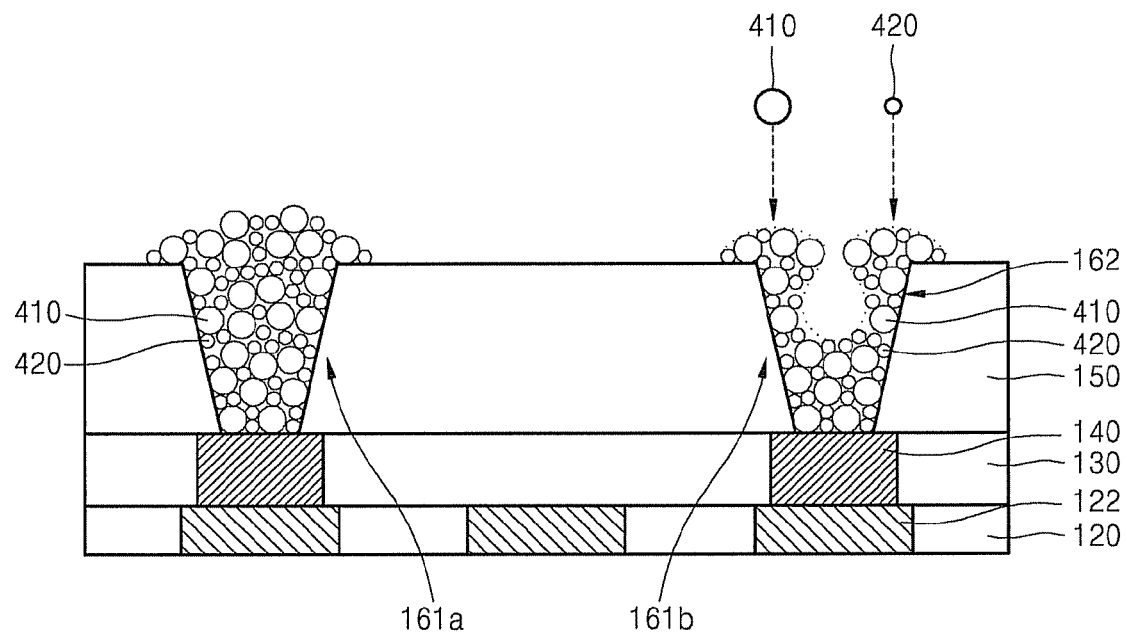

Referring to FIGS. 10 and 12, the third interlayer insulating layer 150 may be etched to form an opening 155 exposing at least a part of the lower electrode 140, in operation S220. The opening 155 may be trench shaped so as to form the phase-change material layer 160a with a line shape extending in one direction as shown in FIG. 4. The opening 155 may be hole shaped to form the phase-change material layer 160b with an individually separated circular shape and/or a polygonal shape as shown in FIG. 5. Referring to FIGS. 10 and 13, the opening 155 may be filled by a phase-change material 162 by using the first phase-change material groups 410 of the first size, and the second phase-change material groups 420 of the second size smaller than the first size, for example, via the sputtering described above, in operation S230. Operation 5230 may be performed, for example, by using operations S110-S130 of FIG. 9. The opening 155 may be filled by the phase-change material 162 without a defect due to an overhang. As shown in FIG. 13, the opening 155 may be filled as shown in a first case 161a, but may include a defect due to an overhang as shown in a second case 161b.

Figure 14:
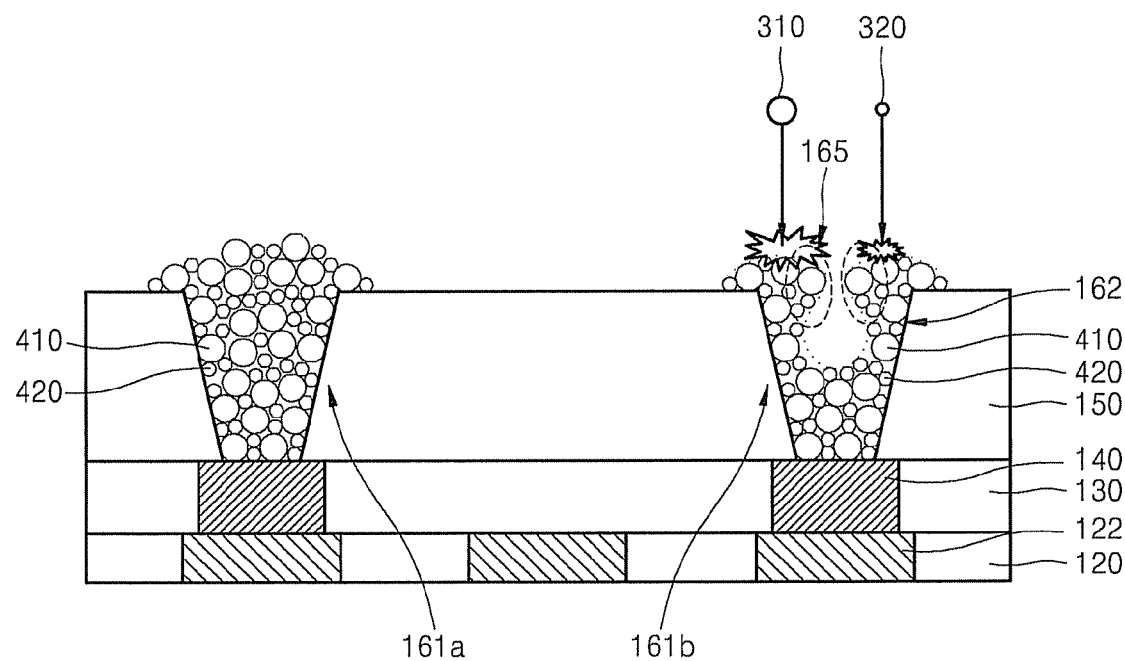

Referring to FIGS. 10 and 14, at least a part of the phase-change material 162 filled in the opening 155 may or may not be plasma-etched, in operation S240. Operation S240 may be performed by using at least one of the first and second gas ions 310 and 320. The first or second gas ions 310 or 320 may etch the part of the phase-change material 162 filled in the opening 155, and thus a defect (e.g., an overhang 165) may be removed. As described above, operations S230 and S240 may be performed simultaneously, sequentially or alternately repeatedly. Ions with a small ion size and/or a small molecular weight, such as the second gas ions 320, may have excellent etching effect. This is because gas ions with a relatively small ion size may easily penetrate into a minute structure, for example, the opening 155. For example, neon ions and/or helium ions may be used to facilitate a better and/or improved etch effect over argon ions.

Figure 15:
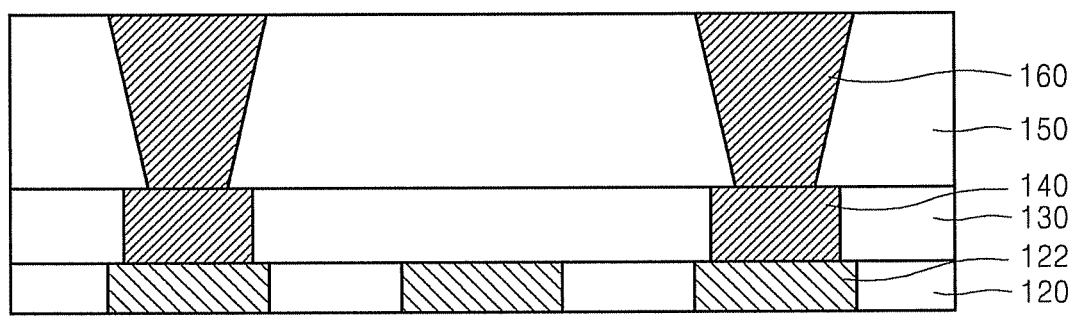

Referring to FIGS. 10 and 15, the phase-change material layer 160 may be heat-treated in operation S250. The phase-change material layer 160 may be formed on the lower electrode 140. Although not illustrated, the phase-change material layer 160 may be flattened via a planarization process (e.g., an etch-back and/or CMP process).

Figure 16:
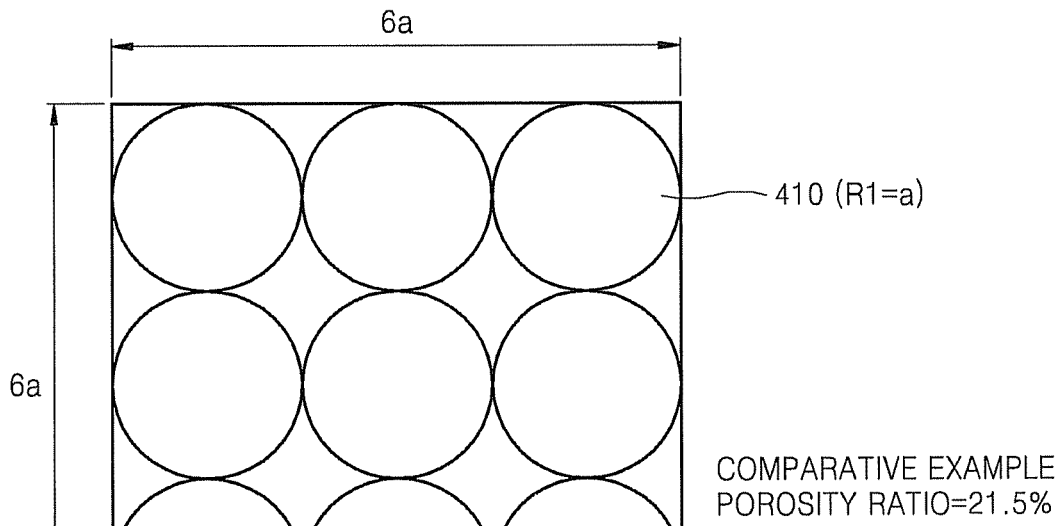
Figure 16:
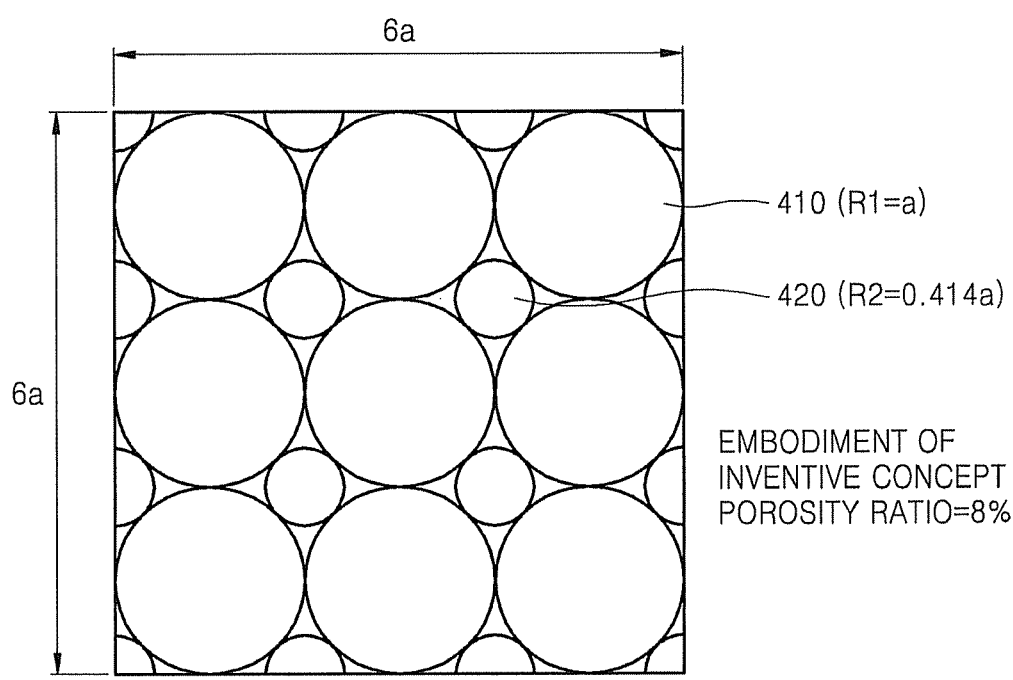

FIG. 16 includes diagrams illustrating a comparison between densification of a phase-change material layer according to at least one example embodiment of the inventive concepts and a comparative example. For simple and clear description, FIG. 16 may be based on the following assumptions. The first and second phase-change material groups 410 and 420 may be globular shaped and may be regularly arranged. A group radius R1 of the first phase-change material groups 410 may be "a", and an atom radius R2 of the second phase-change material groups 420 may be "b". All of the second phase-change material groups 420 may be in gaps between the first phase-change material groups 410.

Referring to FIG. 16, when the phase-change material layer only includes the first phase-change material groups 410 as in the comparative example, an area of the gap may be obtained by subtracting an area ($9\pi a^2$) occupied by the phase-change material groups 410 from an area of a square (e.g., $36a^2$) which may be $7.74a^2$. A porosity ratio may be about 21.5% (=7.74/36). On the other hand, when the phase-change material layer includes both the first and second phase-change material groups 410 and 420, an area of the gap may be obtained by subtracting the area ($9\pi a2$) occupied by the phase-change material groups 410 and an area (e.g., $9\pi 0.4142a2$) occupied by the second phase-change material groups 420 from the area of the square (i.e., $36a^2$), which may be about $2.9a^2$. A porosity ratio may be about 8% (=2.9/36). The porosity ratio of the phase-change material layer according to the embodiment of the inventive concept may be smaller than that of the comparative example, and may be in the range from about 21.5% to about 8%. The phase-change material layer may be formed according to the method of the current embodiment may have a dense structure with small gaps.

Figure 17:
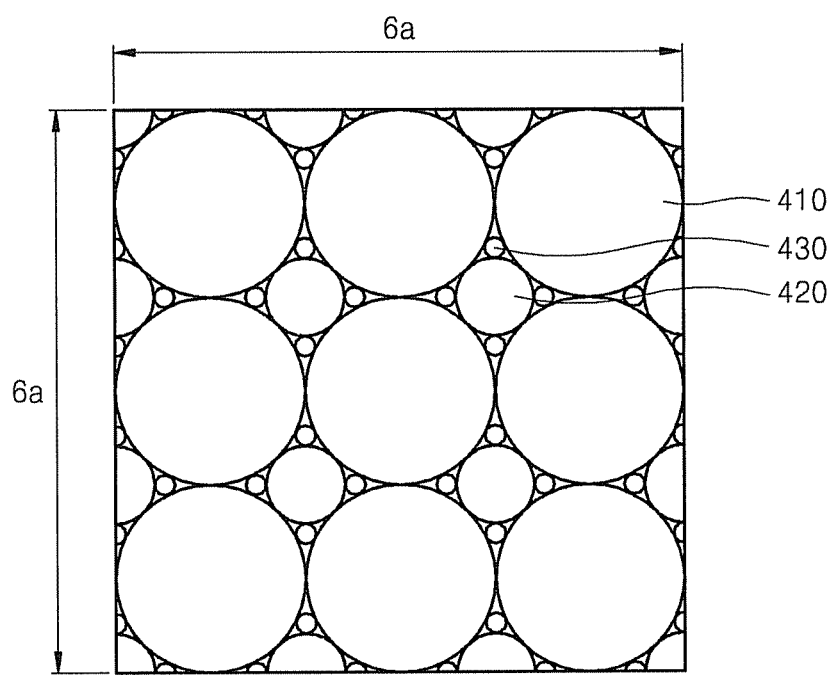

FIG. 17 is a diagram illustrating phase-change material layers formed according to methods of manufacturing non-volatile memory devices included in at least one example embodiment of the inventive concepts. Referring to FIG. 17, the phase-change material layer may include phase-change material groups of three different sizes. Third phase-change material groups 430 may be a smaller size than the second phase-change material groups 420, and fill the gaps that may not filled by the second phase-change material groups 420. The phase-change material layer may be of a relatively denser structure. The second phase-change material groups 420 may be a size between the size of the first phase-change material groups 410 and the size of the third phase-change material groups 430.

The phase-change material layer of FIG. 17 may be obtained by, for example, further separating third phase-change material groups of a size between a size of first phase-change material groups and a size of second phase-change material groups from the method of FIG. 10. For example, three types of gas ions of different ion sizes and/or different molecular weights may be used, and/or the third phase-change material groups may be separated by accelerating gas ions by using acceleration voltage in three levels.

Figure 18:
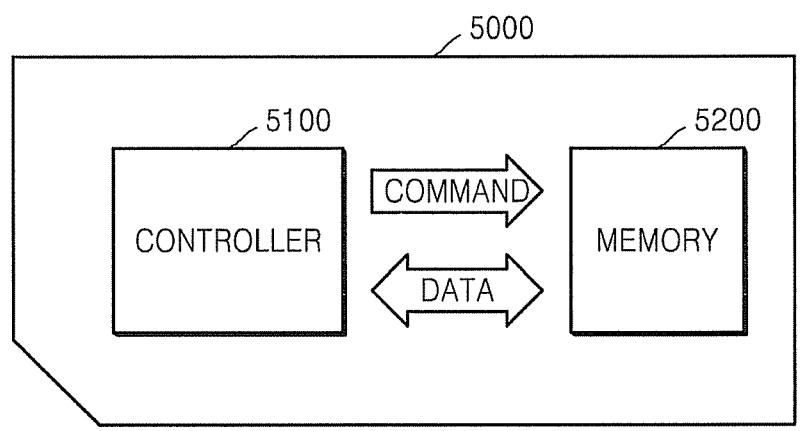

FIG. 18 is a schematic diagram illustrating memory cards 5000 according to example embodiments of the inventive concepts. Referring to FIG. 18, a controller 5100 and a memory 5200 may send/receive electric signals to/from each other. For example, when the controller 5100 gives a command to the memory 5200, the memory 5200 may send data. The memory 5200 may include the phase change memory device according to at least one example embodiment of the inventive concepts described with respect to FIGS. 1-17. The phase change memory devices according to the various example embodiments of the inventive concepts may be disposed in arrays in correspondence to the logic gate design. Such arrays may be generally known in the art. The memory arrays disposed in a plurality of rows and columns may include one or more memory array banks (not shown). The memory 5200 may include the memory arrays (not shown) or the memory array banks (not shown), all of which may be known in the art. The memory card 5000 may further include conventional members, such as a conventional row decoder (not shown), a column decoder (not shown), input/output (I/O) buffers (not shown), and/or a control resistor (not shown) in order to drive the memory array bank (not shown), all of which are known in the art. The memory card 5000 may be used in memory devices, for example, a memory card (e.g., a memory stick card, a smart media (SM) card, a secure digital (SD) card, a mini SD card, and/or a multi media card (MMC)).

Figure 19:
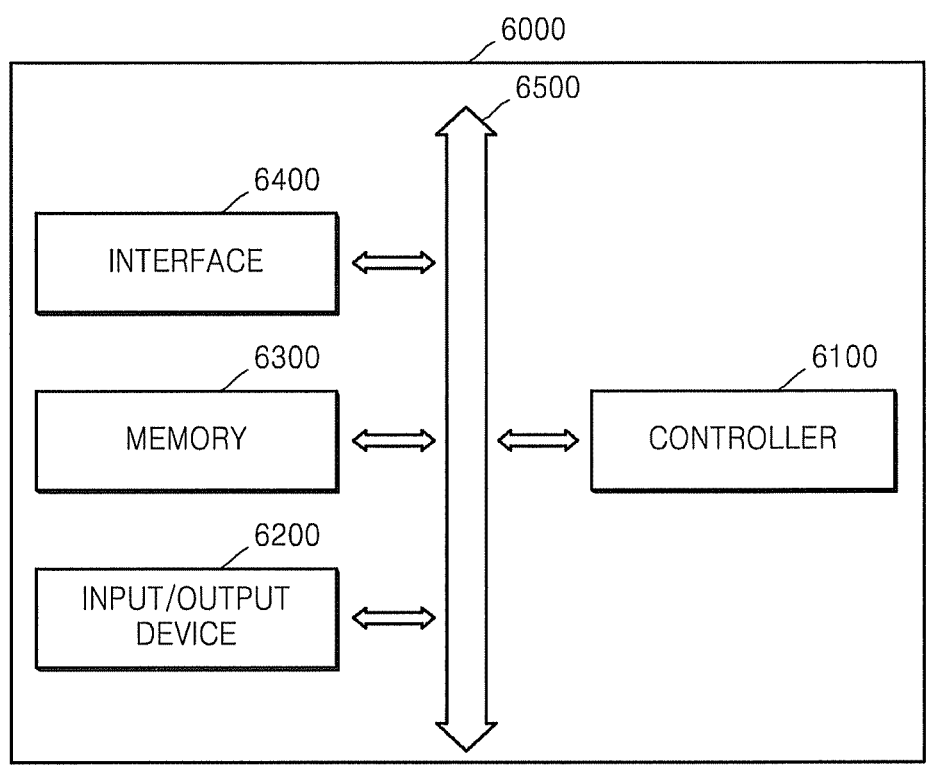

FIG. 19 is a schematic diagram illustrating systems according to example embodiments of the inventive concepts. Referring to FIG. 19, a system 6000 may include a controller 6100, an input/output device 6200, a memory 6300 and an interface 6400. The system 6000 may be a mobile system and/or a system that transmits and/or receives data. The mobile system may be a personal digital assistant (PDA), a portable computer, a web tablet, a wireless phone, a mobile phone, a digital music player and/or a memory card. The controller 6100 may execute a software program and may control the system 6000. The controller 6100 may be a microprocessor, a digital signal processor, a microcontroller and/or the like. The input/output device 6300 may be used to input or output data of the system 6000.

The system 6000 may be connected to an external apparatus, for example, a personal computer and/or a network, using the input/output device 6200, to send/receive data to/from the external apparatus. The input/output device 6200 may be a keypad, a keyboard and/or a display. The memory 6300 may store codes and/or data for operating the controller 6100 and/or may store data processed by the controller 6100. The memory 6300 may include a phase change memory device according to at least one example embodiment of the inventive concepts described with respect to FIGS. 1-17. The interface 6400 may be a data transmission path between the system 6000 and an external apparatus. The controller 6100, the input/output device 6200, the memory 6300, and the interface 6400 may communicate with one another by a bus 6500. For example, the system 6000 may be used for a mobile phone, a MP3 player, a navigation system, a portable multimedia player (PMP), a solid state disk (SSD), and/or a household appliance.

While example embodiments have been particularly shown and described, it will be understood by one of ordinary skill in the art that variations in form and detail may be made therein without departing from the spirit and scope of the claims.

What is claimed is:

1. A method of manufacturing a non-volatile memory device, the method comprising:
   separating at least one first phase-change material group and at least one second phase-change material group from a target, a size of the first phase-change material group being different from a size of the second phase-change material group; and
   forming a phase-change material layer on an object, the phase-change material layer including the first and second phase-change material groups,
   wherein the first phase-change material group and the second phase-change material group have the same characteristics.

2. The method of claim 1, wherein the separating includes separating the first and second phase-change material groups using different gas ions.

3. The method of claim 2, wherein at least one of an ionic size and molecular weight of the different gas ions are different.

4. The method of claim 2, wherein the different gas ions are ions of at least two of argon, helium, and neon.

5. The method of claim 1, wherein the separating includes applying different levels of an acceleration voltage to a same gas ion.

6. The method of claim 1, wherein the separating includes separating at least one third phase-change material group with a size between the size of the first phase-change material group and the size of the second phase-change material group.

7. The method of claim 1, further comprising:
   plasma-etching at least a part of the phase-change material layer.

8. The method of claim 7, wherein the forming a phase-change material layer and the plasma-etching are performed at a same time.

9. The method of claim 7, wherein the forming a phase-change material layer and the plasma-etching are alternately performed a plurality of times.

10. The method of claim 1, further comprising:
    heat-treating the phase-change material layer after the forming a phase-change material layer.

11. The method of claim 1, wherein the forming a phase-change layer includes forming the phase-change layer to penetrate into the object.

12. The method of claim 11, wherein the forming a phase-change layer includes etching the object to expose a conductive layer included in the object.

13. The method of claim 12, wherein the phase-change material layer is formed on the conductive layer.

14. The method of claim 11, wherein a shape of the phase-change material layer is one of a shape extending in one direction and an individually separated shape.

15. A method of manufacturing a non-volatile memory device, the method comprising:
    forming a lower electrode on a substrate;
    forming an insulating layer on the lower electrode;
    etching a region of the insulating layer to expose at least a part of the lower electrode; and
    forming a phase-change material layer in the region, the phase-change material layer including a plurality of phase-change material groups of different sizes,
    wherein the plurality of phase-change material groups have the same characteristics.

16. A method of manufacturing a non-volatile memory device, the method comprising:
    forming a heterogeneous phase-change layer including a mixture of a plurality of first groups of a first phase-change material and a plurality of second groups of a second phase-change material, the forming a heterogeneous phase-change layer including,
    forming the first groups to a different volume than the second groups, and
    forming the first groups to include at least one element in common with the second groups.

17. The method of claim 16, wherein the forming a heterogeneous phase-change layer includes forming the phase-change layer to include a mixture of the first groups, the second groups and a plurality of third groups of a third phase-change material, a volume of the third groups different from the volumes of the first and second groups, the first through third phase-change materials including a same material.

18. The method of claim 17, wherein:
    the forming a heterogeneous phase-change layer includes cyclically depositing and etching the first through third groups a plurality of times; and
    the depositing of the first through third groups includes sputtering a phase-change material using a plasma including different ions.

* * * * *